(12) United States Patent
Anderson et al.

(10) Patent No.: US 6,827,793 B2
(45) Date of Patent: Dec. 7, 2004

(54) DRIP MANIFOLD FOR UNIFORM CHEMICAL DELIVERY

(75) Inventors: Don E. Anderson, Morgan Hill, CA (US); Katrina A. Mikhaylich, San Jose, CA (US); Mike Ravkin, Sunnyvale, CA (US); John M. de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/662,096

(22) Filed: Sep. 12, 2003

(65) Prior Publication Data

US 2004/0060575 A1 Apr. 1, 2004

Related U.S. Application Data

(63) Continuation of application No. 09/538,865, filed on Mar. 29, 2000, now Pat. No. 6,622,335.

(51) Int. Cl.[7] .............................. B08B 1/04; B08B 3/00; B08B 7/00
(52) U.S. Cl. ........................................... 134/6; 134/902
(58) Field of Search ............................... 134/6, 7, 902; 15/77, 88.3; 239/550, 589, 596, 601, DIG. 19

(56) References Cited

U.S. PATENT DOCUMENTS

| | | | | | |
|---|---|---|---|---|---|
| 3,762,651 | A | * | 10/1973 | Condolios | 239/468 |
| 4,365,757 | A | * | 12/1982 | Alajos et al. | 239/567 |
| 5,004,151 | A | * | 4/1991 | Dupre | 239/2.2 |
| 5,723,019 | A | * | 3/1998 | Krusell et al. | 134/6 |
| 6,491,760 | B2 | * | 12/2002 | Ishihara et al. | 134/6 |
| 6,733,596 | B1 | * | 5/2004 | Mikhaylichenko et al. | 134/6 |

* cited by examiner

Primary Examiner—Frankie L. Stinson
Assistant Examiner—Saeed Chaudhry
(74) Attorney, Agent, or Firm—Martine & Penilla, LLP

(57) ABSTRACT

A method for cleaning a wafer with a drip nozzle being configured for use in a drip manifold that is oriented over a brush of a wafer cleaning system is provided. The drip nozzle has a first end and a second end with a passage defined there between where the passage includes a wall that extends longitudinally between the first end and the second end. An orifice is defined within the passage and located at the first end of the drip nozzle. The method includes inputting a fluid into the drip nozzle at an acute angle relative to a longitudinal extension of the wall and reflecting the fluid stream off an internal wall of the drip nozzle at least twice in a direction that is toward the second end. The method further includes outputting at least one substantially uniform drop from the second end of the passage.

20 Claims, 11 Drawing Sheets

DRIP MANIFOLD FOR UNIFORM CHEMICAL DELIVERY

CROSS REFERENCE TO RELATED APPLICATION

This application is a continuation and claims priority from co-pending U.S. patent application Ser. No. 09/538,865 filed on Mar. 29, 2000 now U.S. Pat. No. 6,622,335 and entitled "DRIP MANIFOLD FOR UNIFORM CHEMICAL DELIVERY" which is hereby incorporated by reference in its entirety.

BACKGROUND OF THE INVENTION

1. Field of the Invention

The present invention relates to semiconductor wafer cleaning and, more particularly, to techniques for applying fluids over a cleaning brush and improving wafer cleaning throughput and efficiency.

2. Description of the Related Art

In the semiconductor chip fabrication process, it is well-known that there is a need to clean a wafer where a fabrication operation has been performed that leaves unwanted residuals on the surface of the wafer. Examples of such a fabrication operation include plasma etching (e.g., tungsten etch back (WEB)) and chemical mechanical polishing (CMP). If left on the surface of the wafer for subsequent fabrication operations, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residue on the surface of the wafer.

FIG. 1A shows a high level schematic diagram of a wafer cleaning system 50. The cleaning system 50 typically includes a load station 10 where a plurality of wafers in a cassette 14 may be inserted for cleaning through the system. Once the wafers are inserted into the load station 10, a wafer 12 may be taken from the cassette 14 and moved into a brush station one 16a, where the wafer 12 is scrubbed with selected chemicals and water (e.g., de-ionized (DI) water). The wafer 12 is then moved to a brush station two 16b. After the wafer has been scrubbed in brush station 16, the wafer is moved into a spin, rinse, and dry (SRD) station 20 where DI water is sprayed onto the surface of the wafer and spun to dry. During the rinsing operation in the SRD station, the wafer rotates at about 100 rotations per minute or more. After the wafer has been placed through the SRD station 20, the wafer is moved to an unload station 22.

FIG. 1B shows a simplified view of a cleaning process performed in a brush station 16. In brush station 16, the wafer 12 is inserted between a top brush 30a and a bottom brush 30b with top surface 12a facing up. The wafer 12 is capable of being rotated with rollers (not shown) to enable the rotating brushes 30a and 30b to adequately clean the entire top and bottom surfaces of the wafer 12. In certain circumstances, the bottom surface of the wafer is required to be cleaned as well because contaminants from the bottom may migrate to the top surface 12a. Although both the top surface 12a and the bottom surface of the wafer 12 are scrubbed with the brushes 30, the top surface 12a that is scrubbed with the top brush 30a is the primary surface targeted for cleaning, since the top surface 12a is where the integrated circuit devices are being fabricated. To more effectively clean the wafer 12, a cleaning solution can be applied onto the top brush 30a by the use of a drip manifold 13a. In this example, the drip manifold 13a is attached to a drip control 13 which is in turn connected to a fluid source 24. The fluid source 24 pumps fluid (e.g., any cleaning chemical or DI water) through the fluid control 13 which controls the amount of fluid entering the drip manifold 13a. After receiving the fluid from the fluid control 13, the drip manifold 13a then expels a non-uniform drip 32 onto the top brush 30a. As will be discussed below, this non-uniform drip 32 has been observed to cause problems in cleaning operations.

FIG. 1C shows a cross sectional view of the elements depicted in FIG. 1B. When the wafer 12 has been placed on the bottom brush 30b, the top brush 30a is lowered onto the wafer 12. As the top brush 30a is lowered onto the wafer 12, drip control 13 starts the flow of fluid to the drip manifold 13a which releases the non-uniform drip onto the top brush 30a. During this time, both the bottom brush 30a and 30b turn to create the mechanical scrubbing action.

FIG. 1D shows a more detailed side view of the wafer cleaning structure depicted in FIG. 1B. In general, it is a goal to have the fluid provided to the drip manifold 13a expel "droplets" of fluid evenly over the entire length of the brush 32a. To do this, it is common practice to introduce the fluid into the drip manifold 13a at reduced flow rates and pressures. To accomplish this, the fluid source 24 supplies the cleaning fluid through the drip control 13 which regulates the amount of fluid injected into a near end 31a of the drip manifold 13a. Unfortunately, as the fluid enters into the near end 31a, the fluid tends to flow out of the drip manifold faster at that end than at a far end 31b. This differential fluid expulsion occurs because most of the fluid is released through the drip holes at the near end 31a before the fluid can reach the drip holes at the far end 31b. Therefore, if the drip manifold 13a were totally horizontal, more near end drops 32a will be expelled than far end drops 32b. In the prior art, the drip manifold 13a was sometimes tilted downward slightly at a manifold angle Ø 42 to allow more fluid to reach the far end 31b. The manifold angle 42 is determined by finding the optimal angle of the drip manifold 13a which produces the equivalent amount of drip from both the near end 31a and the far end 31b. This manifold angle 42 is measured relative to a y-axis 40a and an x-axis 40b. As the drip manifold 13a expels the far end drops 32a and near end drops 32b onto the top brush 30a, the brushes 30 turn to scrub the wafer 12.

Unfortunately, calibrating the drip manifold 13a to produce the right amount of fluid flow can be a very time consuming and a difficult process. By guesswork and trial and error, numerous manifold angles Ø 42 must be tried to find the optimal flow rate of the cleaning fluid. Even after the optimal flow rate has been found, the drip manifold may need re-calibrating every time the cleaning apparatus is moved to another location. This problem occurs because each different location (even a different section of the same room) can have a floor angle that is different from the previous location. Therefore, as is often the case, if the cleaning apparatus must be moved frequently, the need for constant re-calibration can create large wastes of time and reduce wafer cleaning throughput. In addition, further problems in the maintenance of manifold angle Ø 42 may occur if the drip manifold is moved by a bump or nudging of the cleaning apparatus because even a slight movement of the drip manifold can have the effect of altering the manifold angle Ø 42. Therefore, the prior art drip manifold 13*a* must often be re-calibrated far more often than is desirable or practical.

FIG. 1E depicts a more detailed cross-sectional view of the drip manifold 13*a* which is expelling the non-uniform drip 32 through a drip hole 13*b*. As is common practice, the drip hole 13*b* is formed by drilling a hole into the drip manifold 13*a*. Unfortunately, the drilling process is known to leave hole shavings 13*c* in and around the drip holes 13*b*. These shavings can potentially be introduced over wafers as particulates causing damage to circuits or retard the flow of fluid, thus causing un-even fluid sprays along the drip manifold 13*a*. To compensate for potential hole shavings 13*c* and un-even fluid delivery, it is common practice to deliver fluids to the drip manifold 13*a* at high pressures and flow rates. This is believed to improve the distribution of fluid out of all of the drip holes 13*b* along the drip manifold 13*a*. As consequence, however, this high pressure delivery and flows tend to produce high pressure jets 32'.

Although the distribution of fluids out of the drip holes 13*b* improved, the high pressure jets 32' have the disadvantageous effects of damaging the delicate surface of the brush 32*a*. In some cases, after relatively few cleaning operations, it was noticed that the brush 32*a* became somewhat shredded or frayed. Consequently, the solution of simply increasing fluid delivery flow and pressures caused additional problems beyond those of un-even fluid delivery.

Because of these inherent problems in the present drip manifold 13*a*, additional devices such as pressure regulators, pressure gauges, and flow meters, which are part of the drip control 13, have been used in a largely unsuccessful attempt to prevent over spraying. Unfortunately, even with seemingly proper drip control, unforeseen fluctuations in fluid pressure can occur which may result in the high pressure jet 32' which have been known to damage the top brush 30*a* and/or the wafer 12.

It should be apparent that using the aforementioned drip manifold is unduly inefficient. Such a drip manifold has the downside of taking more time to setup, and requiring a large amount of maintenance time to keep the drip manifold at the perfect manifold angle Ø 42. Moreover, the fluid application must be carefully monitored because of the possible damage to brushes and wafers caused by flow altering effects of fluctuations in fluid pressure and hole shavings 13*c*. Therefore, using prior art dripping mechanisms can cause lower throughput of wafer cleaning and/or cause damage to the brushes and wafers.

In view of the foregoing, there is a need for a drip manifold that avoids the problems of the prior art by improving cleaning fluid dripping and increasing wafer cleaning efficiency and output.

SUMMARY OF THE INVENTION

Broadly speaking, the present invention fills these needs by providing an improved method for providing uniform chemical delivery over brushes of a wafer cleaning system. It should be appreciated that the present invention can be implemented in numerous ways, including as a process, an apparatus, a system, a device, or a method. Several inventive embodiments of the present invention are described below.

In one embodiment, a method for cleaning a wafer with a drip nozzle being configured for use in a drip manifold that is oriented over a brush of a wafer cleaning system is provided. The drip nozzle has a first end and a second end with a passage defined there between where the passage includes a wall that extends longitudinally between the first end and the second end. An orifice is defined within the passage and located at the first end of the drip nozzle. The method includes inputting a fluid into the drip nozzle at an acute angle relative to a longitudinal extension of the wall and reflecting the fluid stream off an internal wall of the drip nozzle at least twice in a direction that is toward the second end. The method further includes outputting at least one substantially uniform drop from the second end of the passage.

In another embodiment, a method for cleaning a wafer with a manifold including at least one drip nozzle is provided. The method includes inputting a fluid into a first end of the at least one drip nozzle at an acute angle relative to a wall that extends longitudinally between the first end and a second end of the at least drip nozzle. The method further includes reflecting the fluid stream off an internal wall of the at least one drip nozzle at least twice in a direction that is toward the second end of the at least one drip nozzle. The method also includes outputting at least one substantially uniform drop from the second end of the passage at a consistent rate, and applying the at least one substantially uniform drop onto a brush.

In yet another embodiment, a method for cleaning a wafer with a manifold including at least one drip nozzle is provided. The method includes inputting a fluid into a first end of the drip nozzle at an acute angle relative to a wall that extends longitudinally between the first end and a second end of the drip nozzle and reflecting the fluid stream off an internal wall of the drip nozzle at least twice in a direction that is toward the second end of the drip nozzle. The method also includes outputting at least one substantially uniform drop from the second end of the passage at a consistent rate and applying the at least one substantially uniform drop onto a brush. The method further includes scrubbing a wafer with the brush.

The advantages of the present invention are numerous. Most notably, by designing a drip manifold which produces consistent dripping of uniform drops, the wafer cleaning efficiency and throughput may be improved. The claimed invention removes the problems of variable cleaning chemical flow which causes problems such as brush and/or wafer damage.

The present drip manifold does not have to be oriented at a specific manifold angle to properly apply the cleaning fluid in the proper manner. This advancement obviates the need for continual re-calibrations of drip manifold systems to obtain and maintain the perfect manifold angle. This feature reduces time spent on maintaining the drip manifold and allows increased wafer cleaning throughput. Moreover, the present drip manifold is nearly immune to fluctuations in cleaning fluid dripped caused by small fluid pressure variations. Further, due to the design of the drip nozzle, flow alterations normally caused by hole shavings are also eliminated. Therefore the drip manifold will allow new drip systems to more easily produce and maintain the type of dripping preferable in the wafer cleaning process.

Other aspects and advantages of the invention will become more apparent from the following detailed description, taken in conjunction with the accompanying drawings, illustrating by way of example the principle invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

An invention of method and systems presenting an improved method for providing uniform chemical delivery over brushes of a wafer cleaning system. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

Figure 1A:
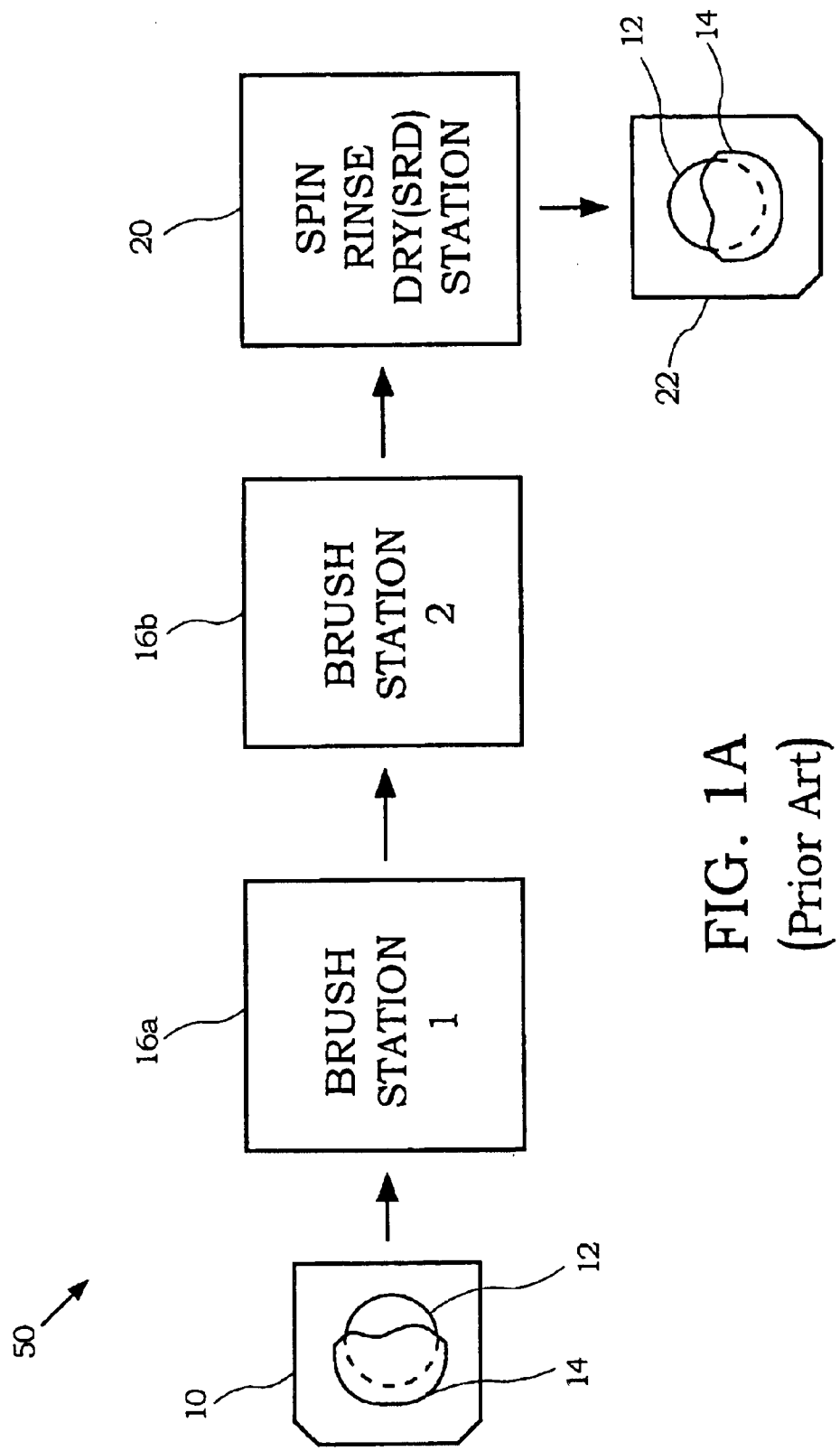
FIG. 1A shows a high level schematic diagram of a wafer cleaning system.
Figure 1B:
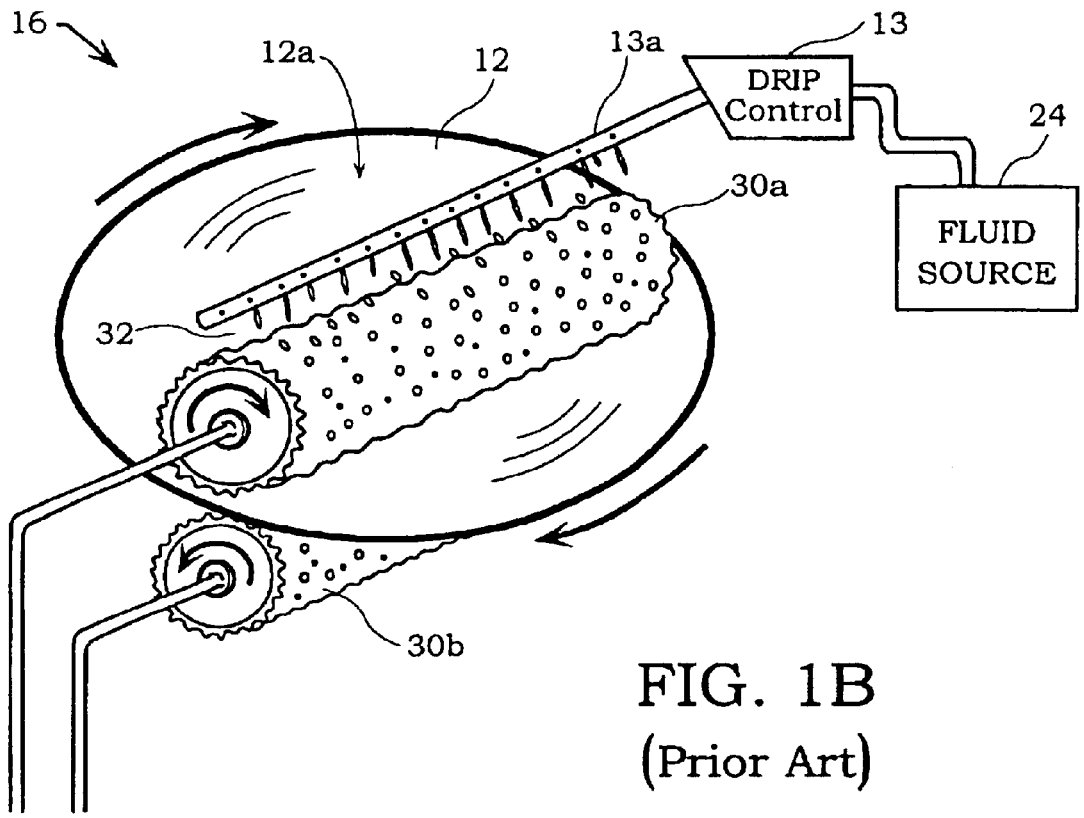
FIG. 1B shows a simplified view of a cleaning process performed in a brush station.
Figure 1C:
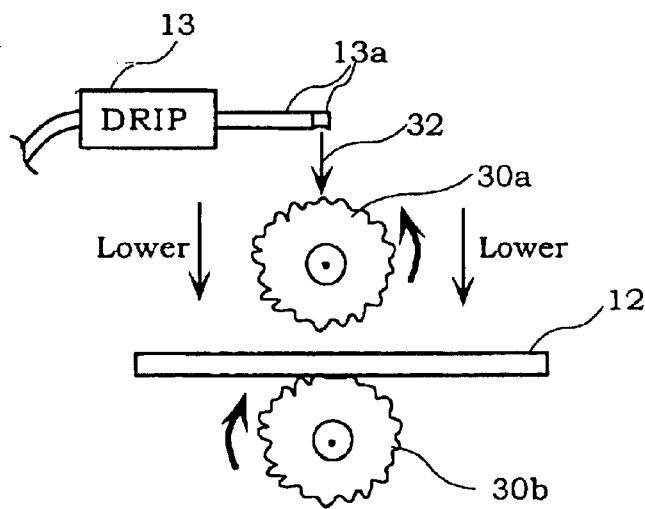
FIG. 1C shows a cross sectional view of the elements depicted in FIG. 1B.
Figure 1D:
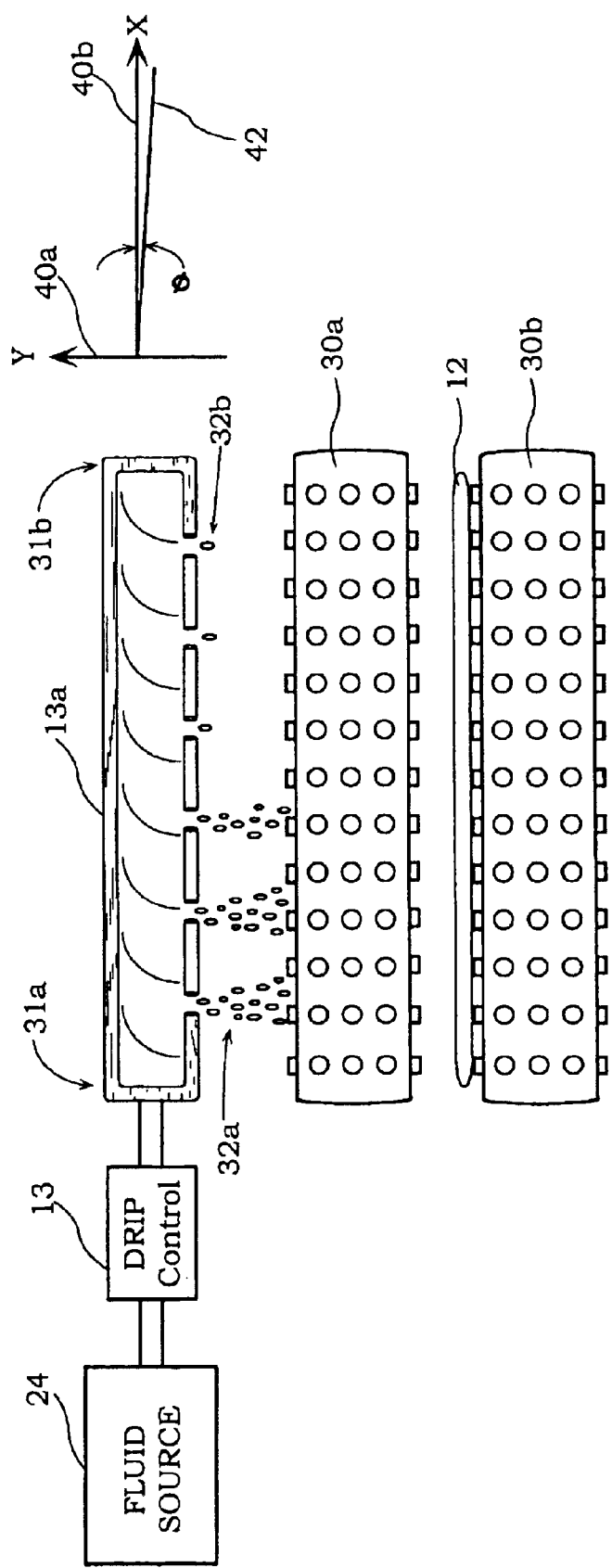
FIG. 1D shows a more detailed side view of the wafer cleaning structure depicted in FIG. 1B.
Figure 1E:
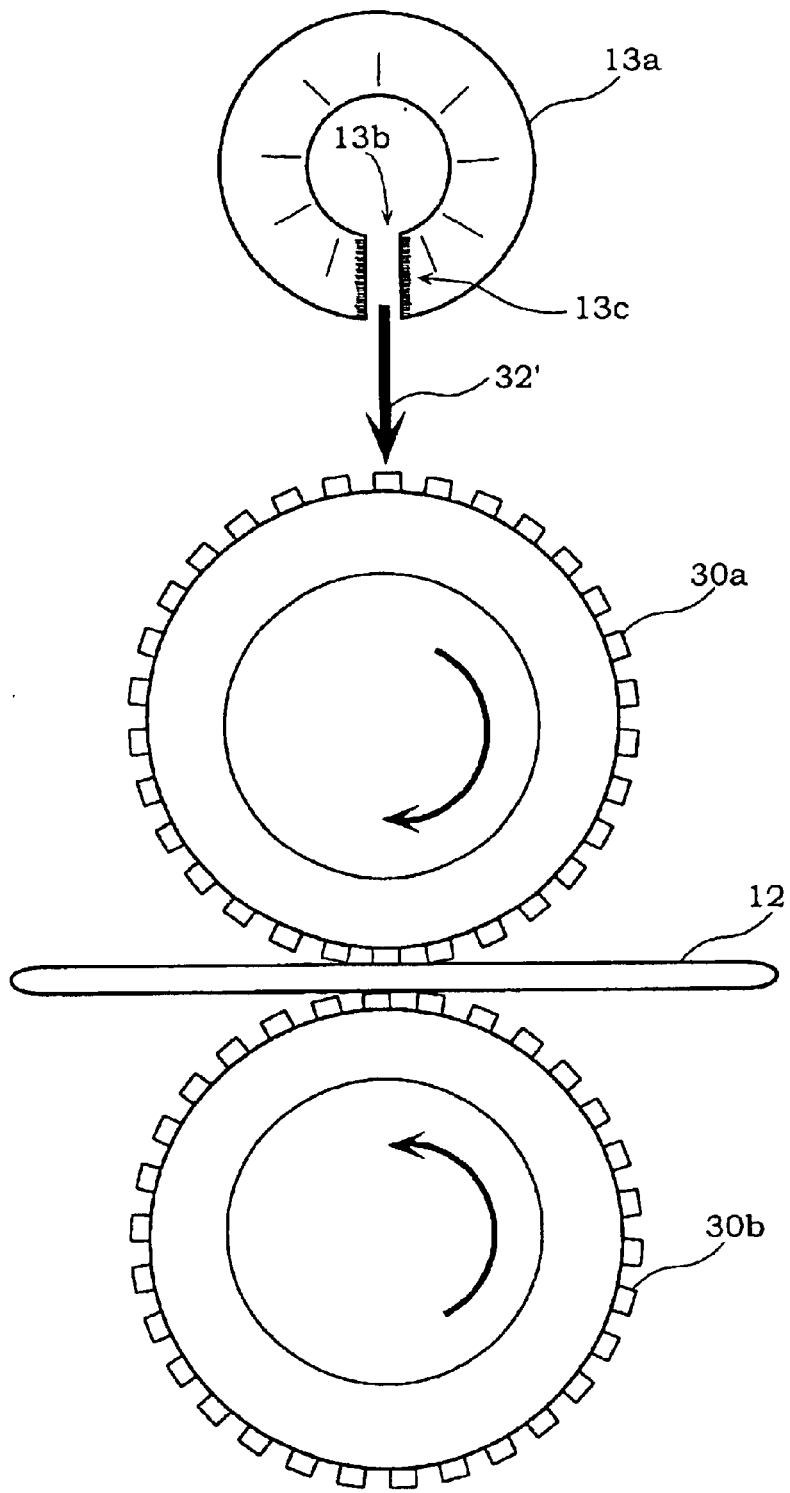
FIG. 1E depicts a more detailed cross-sectional view of the drip manifold which is expelling the non-uniform drip through a hole.
Figure 2A:
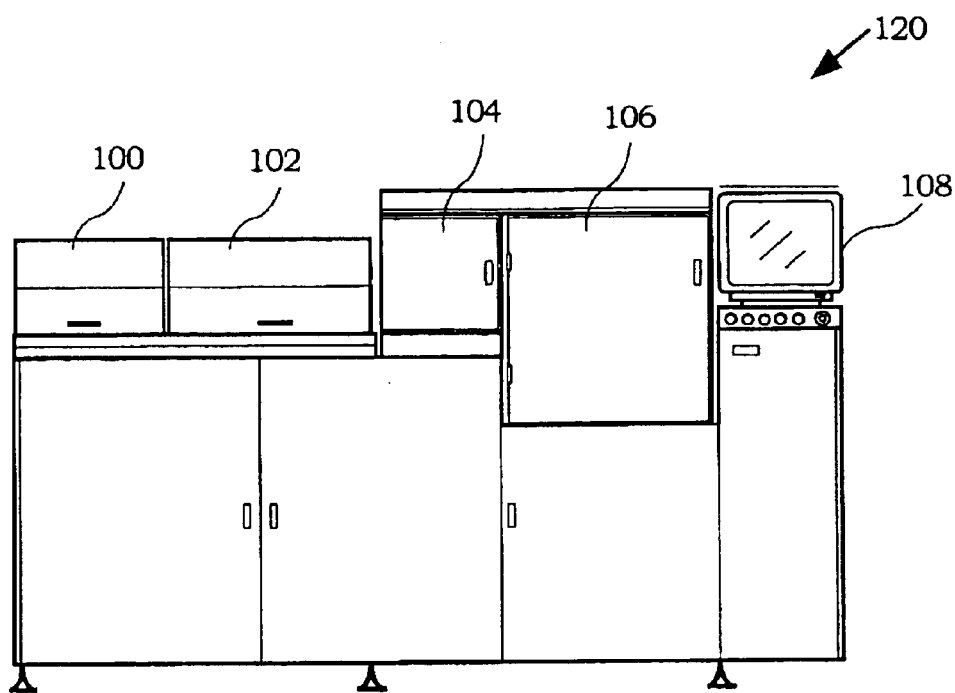
FIGS. 2A and 2B show a side view and a top view, respectively, of a cleaning system, in accordance with one embodiment of the present invention.
Figure 2B:
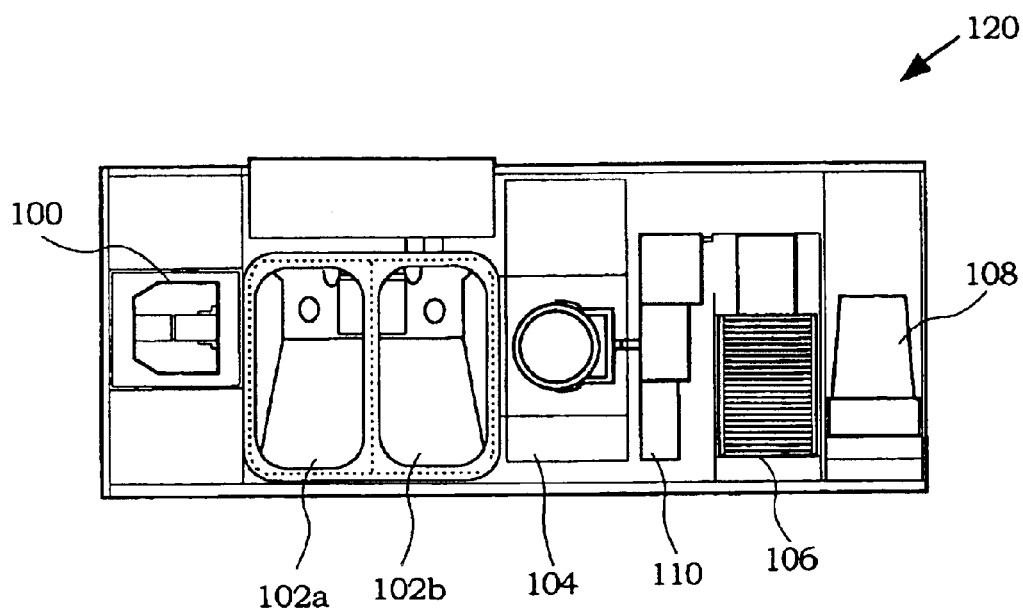

FIGS. 2A and 2B show a side view and a top view, respectively, of a cleaning system 120. The cleaning system 120 typically includes an input station 100 where a plurality of wafers may be inserted for cleaning through the system. Once the wafer 12 is inserted into the input station 100, the wafer 12 may be taken from the input station 100 and moved into a brush station one 102a, where the wafer 12 is scrubbed with selected chemicals and water (e.g., de-ionized water) before being moved to a brush station two 102b. In the brush stations, a drip manifold including a drip nozzle of the present invention is contained. The features of the drip manifold and drip nozzle will be described in greater detail below.

After the wafer 12 has been scrubbed in the brush stations 102, the wafer 12 is moved into a spin, rinse, and dry (SRD) station 104, where de-ionized (DI) water is sprayed onto the surface of the wafer and spun to dry. After the wafer has been placed through the SRD station 104, the wafer 12 is moved to an output station 106. The cleaning system 120 is configured to be programmed and controlled from system electronics 108. Of course, this cleaning system is only exemplary in nature, and any other type of cleaning system that uses brush technology coupled with drip manifolds will also benefit from the advantages of the present invention. For instance, the system can be a standalone brush station for scrubbing wafers horizontally or vertically, or part of a chemical mechanical polishing (CMP) system and clean system combination.

Figure 3A:
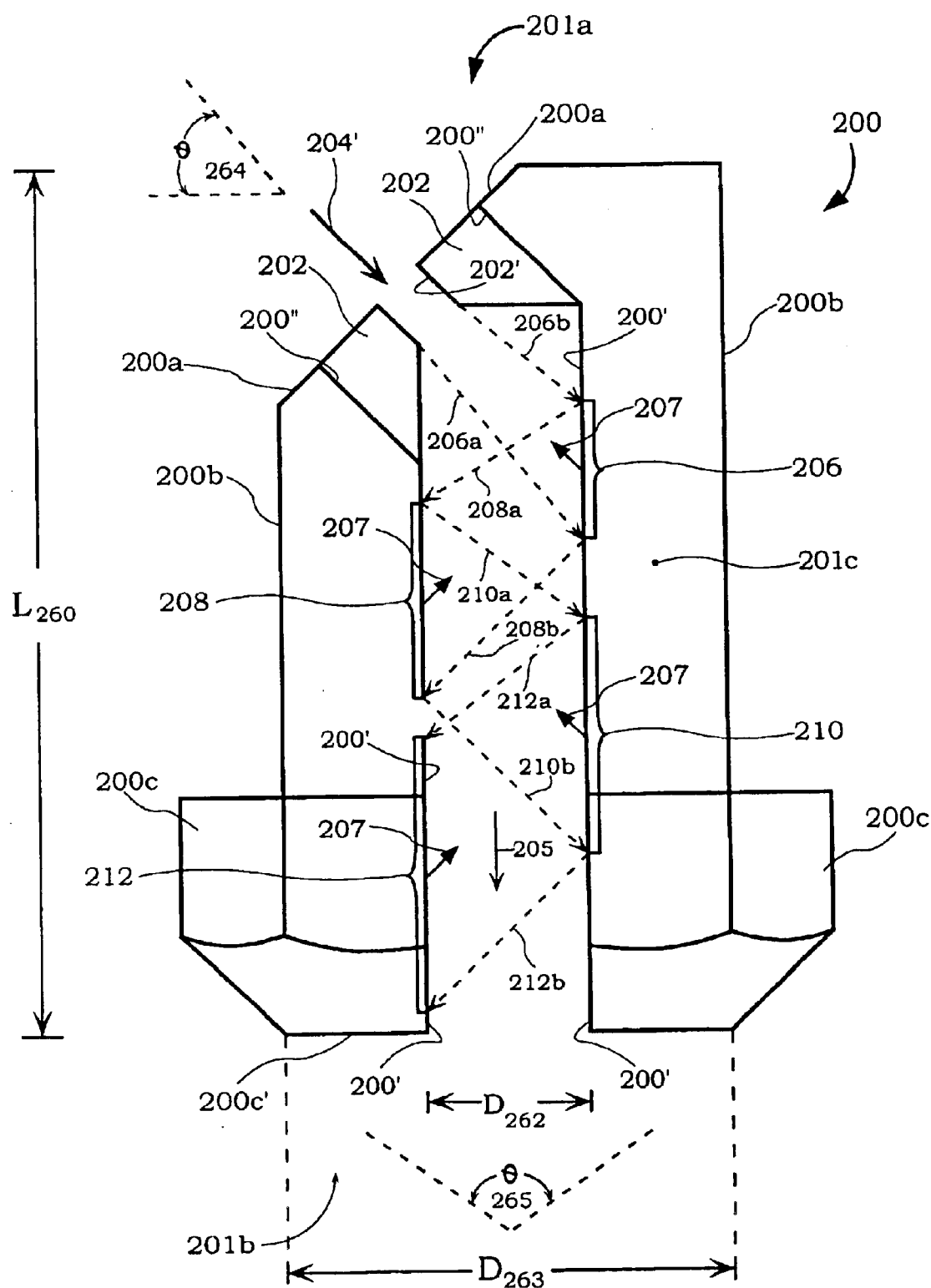
FIG. 3A shows a cross-sectional view of a drip nozzle, in accordance with one embodiment of the present invention.

FIG. 3A shows a cross-sectional view of a drip nozzle 200, in accordance with one embodiment of the present invention. The drip nozzle 200 is configured to provide more consistent dripping of more uniform drops.

In one embodiment, the drip nozzle 200 has a first end 201a and a second end 201b. The drip nozzle 200 has a tubular segment 201c connected to a nozzle head 200c. The drip nozzle 200 contains a passageway between the first end 201a and the second end 201b where fluid can travel. Generally, a passage 205 is defined by a cylindrical shape having an inner surface 200'. In one embodiment, the first end 201a of the drip nozzle 200 will preferably have an angled wall 200a. It should be understood that the angle of the angled wall 200a can be varied depending on fluid flow requirements or any other calibration parameter. The drip nozzle 200 also has an outer nozzle wall 200b. To secure the drip nozzle 200 to a drip manifold (as will be shown below), the outer nozzle wall will preferably have threads (not shown).

In one embodiment, a sapphire orifice 202 is preferably inserted into the angled wall 200a at the first end 201a. In an alternative embodiment, the sapphire orifice can made from any suitable material that is hard enough and compatible with cleaning solutions, and therefore, the sapphire orifice can be made from any material to define an insert orifice. Because a passage 200" is angled into the angled wall 200a, the sapphire orifice 202 is also angled to fit into the passage 200". Thus, the sapphire orifice 202 will include an orifice inner surface 202' that defines an angled path into the passage 205. This angled path serves to create an angled fluid stream that is directed against the drip nozzle inner surface 200' at a stream contact surface 206.

Although sapphire is used in an exemplary embodiment, other materials may be used such as materials that are compatible with various cleaning fluids. Such cleaning fluids may include basic solutions, acidic solutions (e.g., HF), and other fluids. The sapphire material can also be defined with passage ways (e.g., holes) that are defined to tight tolerances, and once formed, leave a very clean unobstructed surface (e.g., smooth surface). Moreover, it should be appreciated by one of ordinary skill in the art that the sapphire orifice 202 may be oriented differently as long as the resultant configuration produces an angled stream of fluid that is directed at the drip nozzle inner surface 200'.

When orifice input fluid 204' first enters the drip nozzle 200, it travels through the sapphire orifice 202. As the resultant angled stream leaves the sapphire orifice 202 and enters the inner passage 205 of drip nozzle 200, it begins to expand and is defined by a stream boundary 206a and a stream boundary 206b. This initial stream then hits against the stream contact surface 206 which is a section of the drip nozzle inner surface 200'. Because the initial stream hits the stream contact surface 206 at an angle, the initial stream reflects off of the stream contact surface 206 and is angled towards the second end 201b of the drip nozzle 200. When this reflection occurs, the initial stream loses velocity and expands to form a first reflected spray with a spray boundary 208a and a spray boundary 208b. When this expansion occurs, portions of the first reflected spray having boundaries 208*a* and 208*b* contact portions of the incoming initial stream having boundaries 206*a* and 206*b*. This contact serves to decrease the velocities of both the initial stream and the first reflected spray.

The first reflected spray then hits spray contact surface 208. By this time, the first reflected spray has expanded so the area of the spray contact surface 208 is larger than the spray contact surface 206. When this contact occurs, the first reflected spray is reflected a second time towards the second end 201*b* of the drip nozzle 200. When the reflection occurs, the first reflected spray loses velocity and a slower moving second reflected spray is produced. This loss in velocity causes a further expansion of the spray boundaries to form a spray boundary 210*a* and a spray boundary 210*b*. As the second reflected spray expands, it comes into contact with the incoming first reflected spray. This contact further reduces the velocities of both the first reflected spray and the second reflected spray.

Figure 3B:
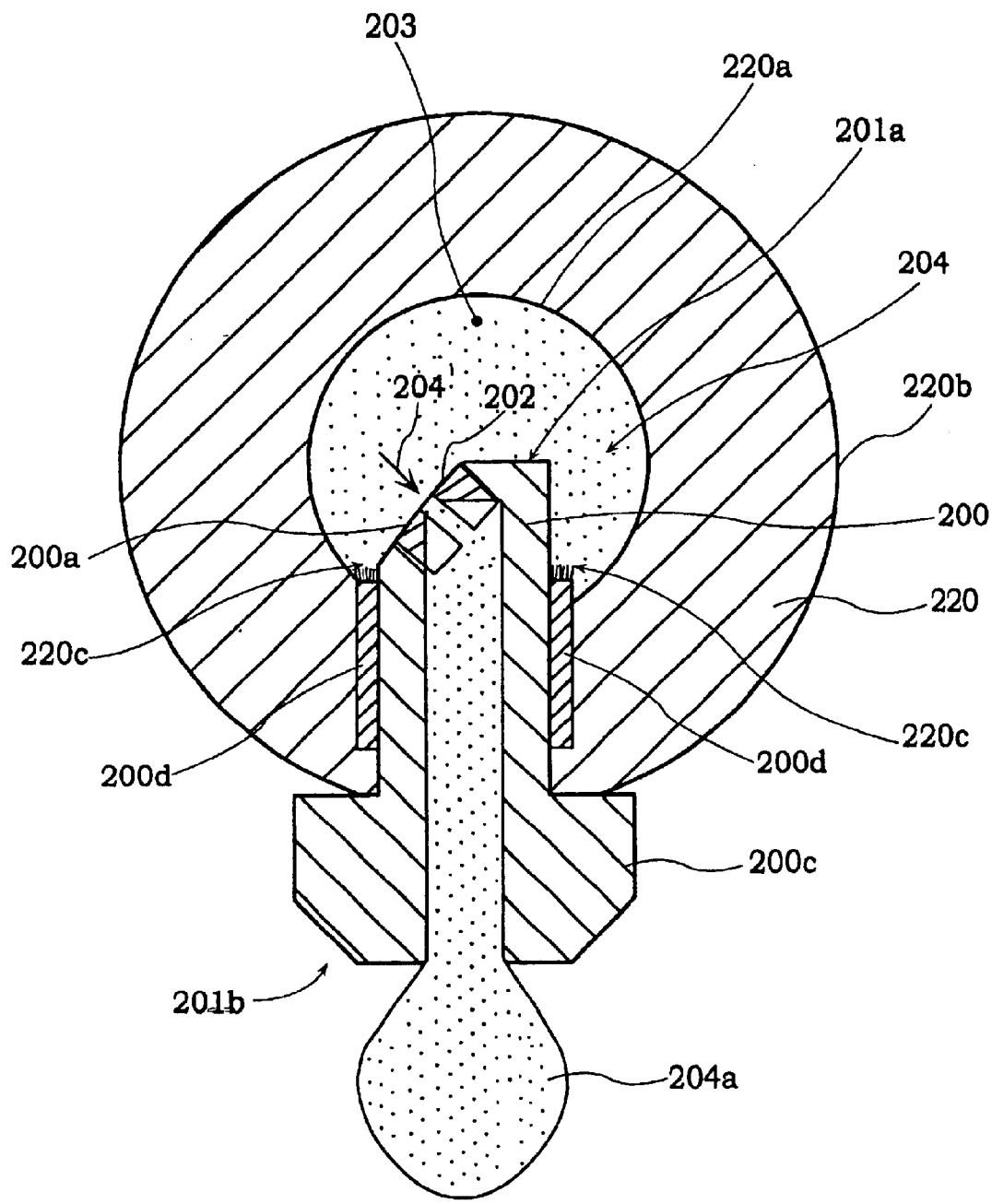
FIG. 3B depicts a cross-sectional view of a drip manifold in accordance with one embodiment of the present invention.
Figure 3C:
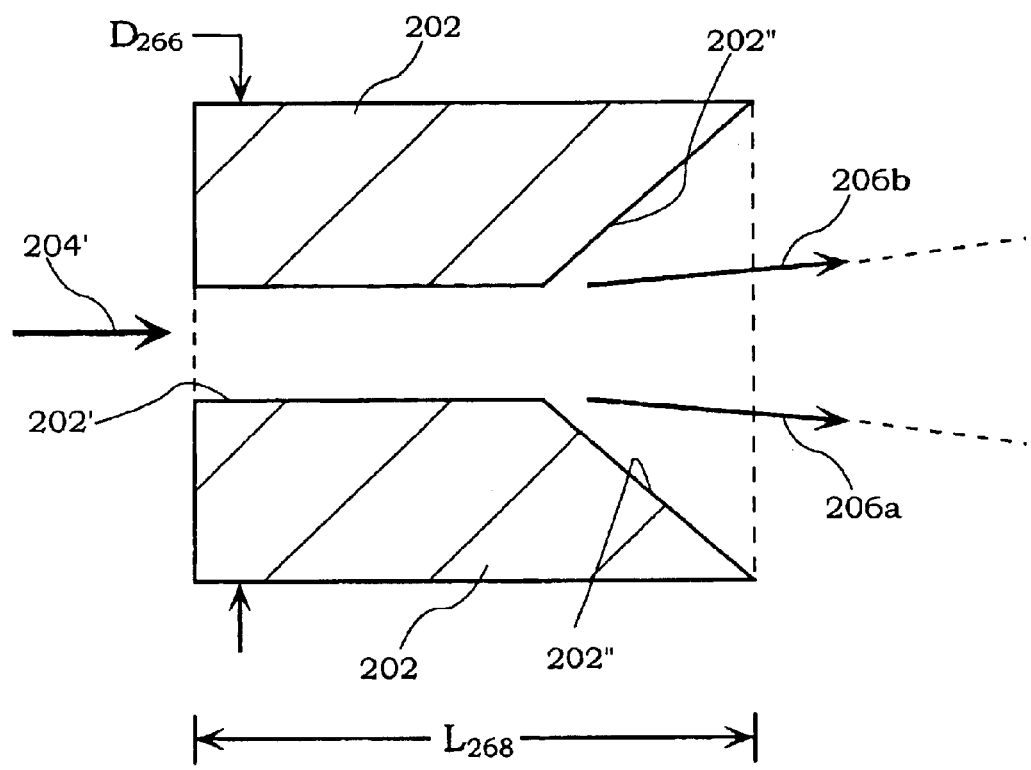
FIG. 3C shows an exploded view of the sapphire orifice manifold in accordance with one embodiment of the present invention.
Figure 3D:
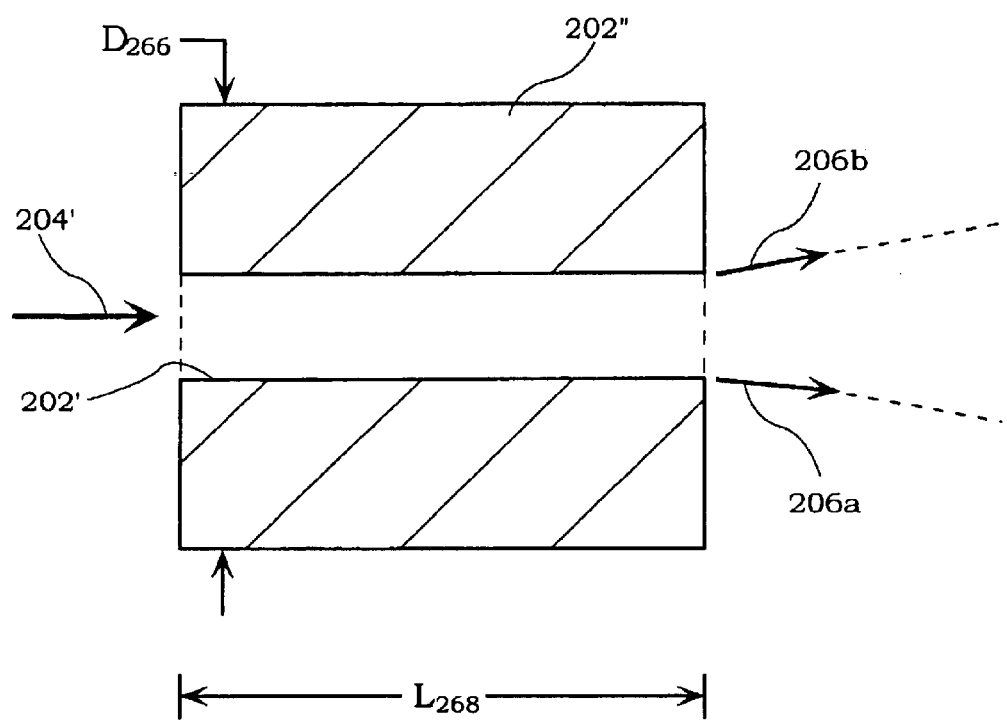
FIG. 3D shows a view of an alternative orifice in accordance with one embodiment of the present invention.

The second reflected spray then contacts a spray contact surface 210. Once again, because of the expansion of the spray in transit, the spray contact surface 210 is larger than the spray contact surface 208. When this contact occurs, the spray is once again reflected at an angle towards the second end 201*b* of the drip nozzle 200 to produce a third reflected spray. When this reflection occurs, the velocity of the spray is decreased again and further expansion of the spray occurs. This expansion forms a spray boundary 212*a* and a spray boundary 212*b*. Moreover, when this spray expansion occurs, the third reflected spray comes into contact with the incoming second reflected spray. When this contact occurs, the velocities of both the second reflected spray and the third reflected spray are decreased.

Therefore, each spray reflection produces a decrease in fluid velocity. These spray reflections continue until the fluid reaches the periphery of a nozzle head 200*c* at the second end 201*b*. By this time, the fluid velocity has slowed significantly. This decrease in velocity creates an accumulation of liquid towards the second end 201*b* of the drip nozzle 200 which creates back forces 207 in the direction of the first end 201*a*. The creation of these back forces 207 serves to further slow down the fluid traveling through the passage 205 of the drip nozzle 200. Therefore, uniform droplets slowly form at the opening of the nozzle head 200*c* creating a controlled, consistent, and uniform dripping action.

In this example, the drip nozzle head 200*c* is configured so it is larger in circumference than the outer nozzle wall 200*b*. The nozzle head 200*c* is also preferably controlled at surface 200*c*' of drip nozzle 200 which further assists in the production of uniform drops. For example, the diameter D263 contributes to the formation of a uniform droplet by defining an area of attachment of the uniform droplet to the nozzle head 200*c*. The uniform droplet grows in size until its mass causes it to separate from the surface 200*c*'. In addition, an angle θ 265 also contributes to the formation of the uniform droplet by preventing fluid from migrating up the nozzle. It should be appreciated that the drip nozzle may be configured in a variety of shapes and sizes to produce similar drops. Additionally, the drip nozzle 200 can be made without the drip nozzle head 200*c*. The actual shape of the drip nozzle 200 will primarily depend on the viscosity of fluid, drip rate, and the environment into which it is being installed. Also, the drip nozzle 200 is preferably manufactured from a material that is compatible with the chemistry of the fluid such as Teflon™ or polyethylene terephthalate (PET). PET materials are known for their high purity and are relatively easy to machine. In one embodiment, the length L260 of the drip nozzle 200 can vary between about 0.02 inch and about 1 inch, and more preferably is about 0.437 inch long. This dimension can generally be varied to any length that will allow for one or more spray reflections off of the drip nozzle inner surface 200'. This will ensure that a more uniform drip is formed. In this embodiment, passage diameter D262 of the drip nozzle 200 can be between about 0.02 inch and about 0.1 inch, and more preferably is about 0.062 inch. Of course, this dimension can be varied depending on the viscosity and desired fluid flow. Still further, the sapphire orifice is preferably angled once inserted into the orifice inner surface 200". This angle can vary widely. For example, the angle θ 264 can be between about 15 degrees and about 75 degrees, and more preferably is set to about 45 degrees. In general, some angle must exist so long as one or more spray reflections off of the drip nozzle inner surface 200' are produced.

FIG. 3B depicts a cross-sectional view of a drip manifold 220 in accordance with another embodiment of the present invention. In this embodiment, the drip manifold 220 has a manifold inner surface 220*a* and a manifold outer surface 220*b*. The drip nozzle 200 is secured to the drip manifold 220 by threads 200*d*. It should be understood that the drip nozzle 200 may be fastened to the drip manifold 220 in a variety of other ways such as pressing the drip nozzle 200 into the drip manifold 220. In one embodiment, the drip nozzle 200 is preferably oriented such that the first end 201*a* protrudes into an inner region 203 of the drip manifold 220. Although any suitable diameter may be used for the inner part of the drip manifold 220, a diameter ranging between about 0.250 inch and 1.00 inch, and more preferably about 0.375 inch may be used. By having the drip nozzle 200 extend into the inner region 203, hole shavings 220*c* (created by the drilling of the hole) are less likely to clog the hole defined by the orifice surface 202'. The inner region 203 of the drip manifold 220 is preferably a cylindrical shape defined by the manifold inner surface 204*a*. When the cleaning fluid is pumped into the drip manifold 220, the inner region 203 is filled by a manifold fluid 204. A portion of the manifold fluid 204 enters the sapphire orifice 202 as orifice input fluid 204'. The orifice input fluid 204' then goes through the numerous reflective actions as described above with reference to FIG. 3A, and a uniform drop 204*a* is released from the nozzle head 200*c*. Of course, in a true drip manifold 220, there will actually be several drip nozzles 200, as will be illustrated below.

FIG. 3C shows an exploded view of the sapphire orifice 202. In this embodiment, the sapphire orifice 202 includes the orifice inner surface 202' defined generally as a cylindrical shape. At one end of the sapphire orifice 202, the inner surface 202' angles out to define an angled surface 202". The angled surface 202" is configured to feed into the passage 205 of the drip nozzle 200. Therefore, in operation, the orifice input fluid 204' enters the sapphire orifice 202 and exits out of one side as defined by the stream boundaries 206*a* and 206*b*. In one embodiment, it is preferable for an outer diameter D266 of the sapphire orifice 202 to be about 0.087 inch. It should be appreciated that the diameter of the orifice inner surface 202' may be varied to produce different flow rates as need. The dimensions of the orifice inner surface 202' are closely controlled to a desired tolerance so that most all of the sapphire orifice 202 of a specific size are nearly identical. In one preferred embodiment, the orifice inner surface 202' may have a diameter that is about 0.010. The length L268 of the sapphire orifice 202 in this example is about 0.047 inch. Of course, the length L268 may be varied depending upon the desired drip characteristics. FIG. 3D shows a view of an alternative orifice 202".

In this embodiment, alternative orifice 202" is preferably also made out of a sapphire material. The orifice inner surface 202' of the alternative orifice 202' keeps a constant configuration and does not angle out into the passage 205 of the drip nozzle 200. In one embodiment, the diameter D266 of the alternative orifice 202" is also about 0.087 inch. It should be appreciated that the diameter of the orifice inner surface 202' may be varied to produce different flow rates as needed. The dimensions of the orifice inner surface 202' are closely controlled to a desired tolerance so that most all of the sapphire orifice 202 of a specific size are nearly identical. In yet another embodiment, it is preferable for length L268 of the alternative orifice 202" to be about 0.047 inch. The length L268 of the alternative orifice 202" may be varied depending upon the drip characteristics desired. The orifice input fluid 204' enters the alternative orifice 202" and exits out of the other side as defined by the stream boundaries 206a and 206b. As mentioned above, the sapphire orifice 202 and the alternative orifice 202" may be made out of other materials that are compatible with different cleaning fluids and that can be defined to exact tolerances and leave a smooth surface after it is formed. The smooth surface thus enables the generation of a more uniform entry point for fluid and gives rise to more controlled droplets from each of the drip nozzles 200 that may be integrated into a drip manifold 220.

Figure 4:
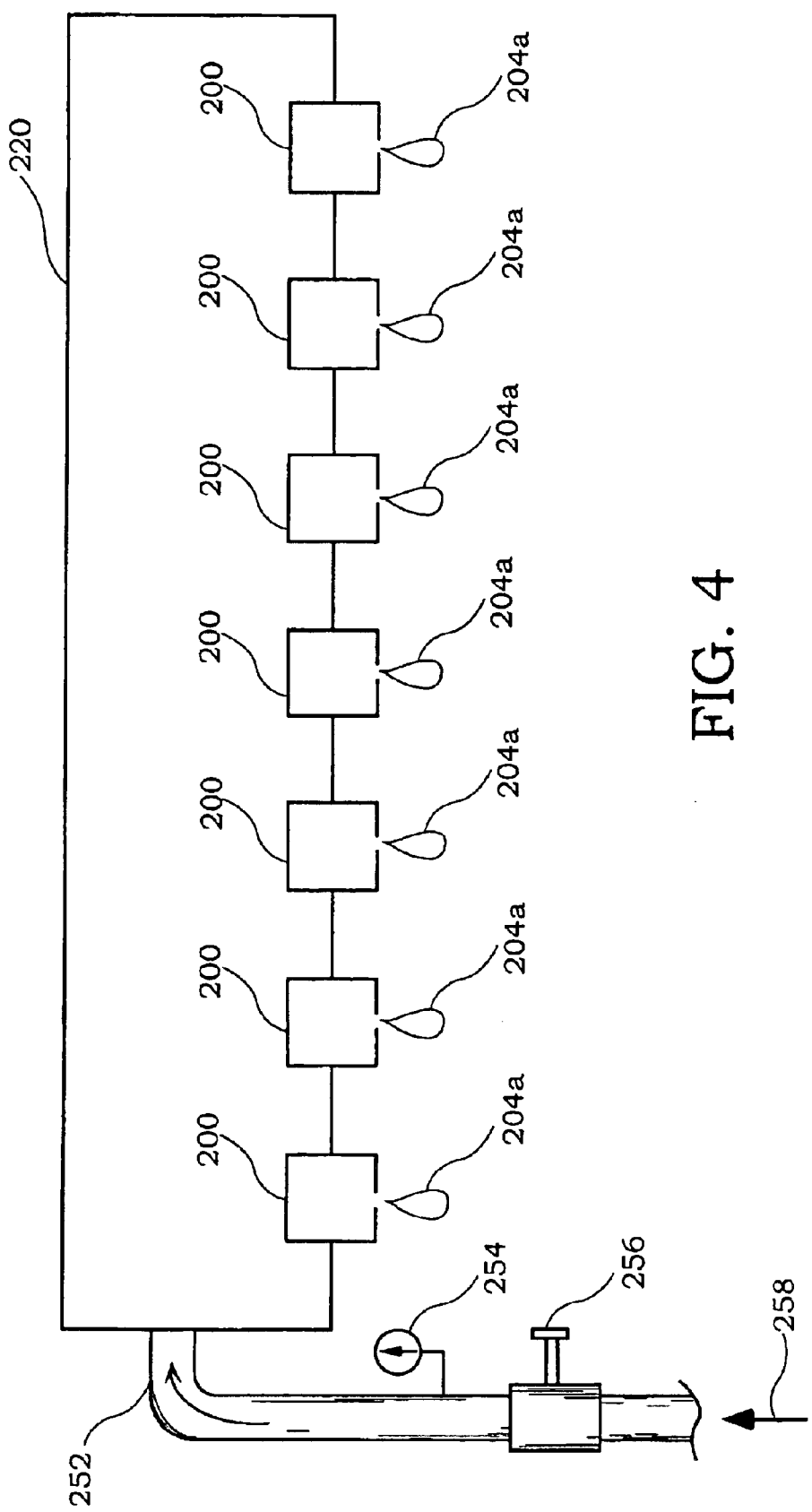
FIG. 4 depicts a side view of the drip manifold containing a plurality of the drip nozzles in accordance with one embodiment of the present invention.

FIG. 4 depicts a side view of the drip manifold 220 containing a plurality of the drip nozzles 200 in accordance with one embodiment of the present invention. In this embodiment, a fluid source 258 is connected by a tubing 252 to a pressure regulator 256. A pressure gauge 254 is then attached to a portion of the tubing 252 connecting the pressure regulator 256 to one end of the drip manifold 220. A plurality of the drip nozzles 200 are secured to the drip manifold 220 as explained above with reference to FIG. 3B. In one embodiment, the drip manifold 220 is preferably a cylindrical structure manufactured out of a Teflon™ material or any other material that is compatible with cleaning chemicals.

In this embodiment, the fluid source 258 generally supplies fluid to the pressure regulator 256 where the pressure of the fluid leading to the drip manifold can be controlled. A pressure gauge 254 monitors the fluid pressure in the tubing 252. By the use of both the pressure regulator 256 and the pressure gauge 254, the fluid pressure (and the resultant dripping) of the cleaning fluids can be controlled. The fluid then passes from the tubing 252 into the drip manifold 220. Once inside the drip manifold 220, the pressurized fluid flows equally into a plurality of the drip nozzles 200. Because the drip manifold 220 may be filled with pressurized fluid, the flow of fluid into all of the drip nozzles 200 is substantially equal. As described above, after the fluid has passed through the drip nozzles 200, the uniform drops 204a drip from the drip nozzles 200 at a constant and controlled rate. Advantageously, the flow of fluid through the drip manifold 220 may be regulated with only the use of the pressure gauge 254 and the pressure regulator 256 without the need for implementing a a flow meter or additional hardware.

Figure 5:
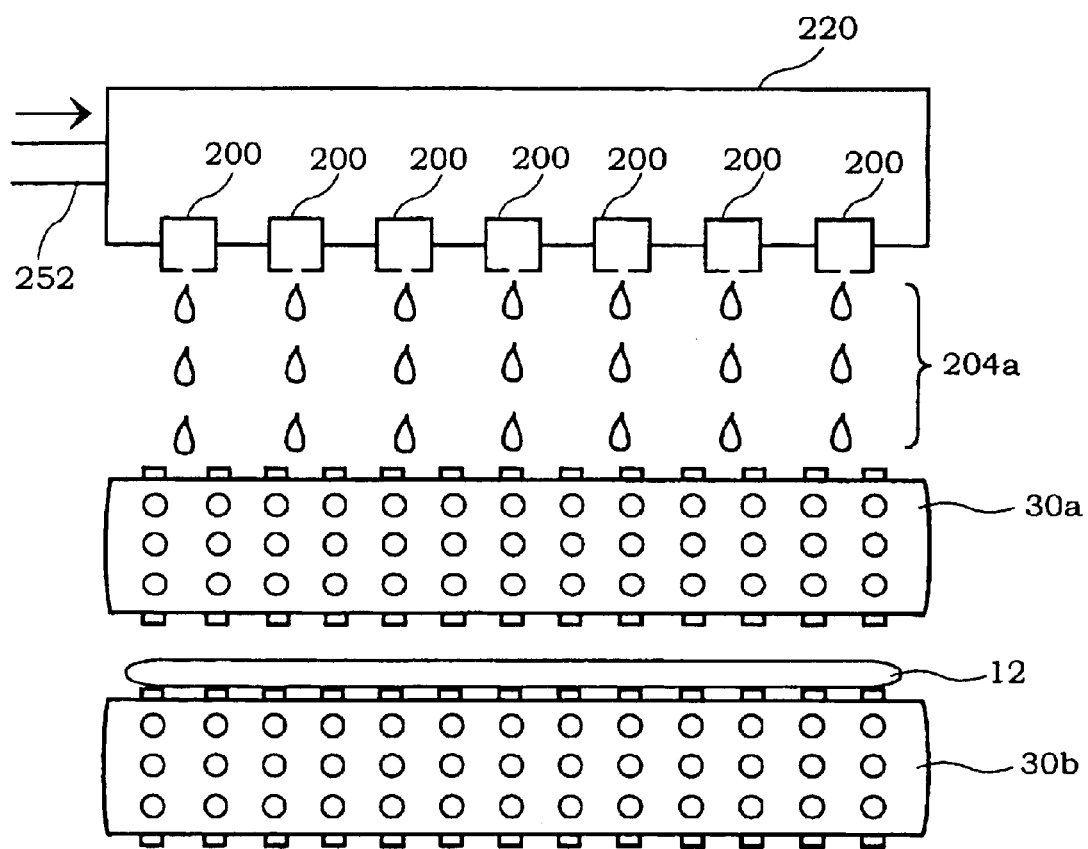
FIG. 5 illustrates a cleaning system using the drip manifold containing a plurality of the drip nozzles in accordance with one embodiment of the present invention.

FIG. 5 illustrates a cleaning system using the drip manifold 220 containing a plurality of the drip nozzles 200 in accordance with one embodiment of the present invention. The tubing 252 is connected to one end of the drip manifold 220. In one embodiment, the drip manifold 220 is preferably positioned over the top brush 30a so the cleaning fluid can be dripped onto the top brush 30a. It is should be appreciated that the drip manifold 220 may be positioned in any orientation which would allow for consistent application of cleaning liquid onto the top brush 30a (or any other brush that is positioned below the drip manifold 220). The wafer 12 is placed on top of the bottom brush 30b and below the top brush 30a. The tubing 252 transports fluid into the drip manifold 220. The fluid passes through the drip nozzles 200 and is released in the form of the uniform drops 204a. As the uniform drops 204a are applied to the top brush 30a at a consistent rate, the brushes 30 can turn thus scrubbing the wafer 12. Therefore, the drip manifold 220 applies precisely the correct amount of cleaning fluid at the desired rate to the top brush 30a which results in optimal cleaning of the wafer 12.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for cleaning a wafer with a drip nozzle for use in a drip manifold that is oriented over a brush of a wafer cleaning system, the drip nozzle having a first end and a second end with a passage defined there between where the passage includes a wall that extends longitudinally between the first end and the second end with an orifice being defined within the passage and located at the first end of the drip nozzle, the method comprising:

inputting a fluid into the drip nozzle at an acute angle relative to a longitudinal extension of the wall;

reflecting the fluid stream off an internal wall of the drip nozzle at least twice in a direction that is toward the second end; and outputting at least one substantially uniform drop from the second end of the passage.

2. A method for cleaning a wafer as recited in claim 1, further comprising:

applying the at least one substantially uniform drop onto a brush.

3. A method for cleaning a wafer as recited in claim 1, wherein the drip manifold is integrated into a cleaning station and the drip manifold extends over a length of the brush.

4. A method for cleaning a wafer as recited in claim 1, wherein inputting a fluid into the drip nozzle includes introducing the fluid into the first end.

5. A method for cleaning a wafer as recited in claim 1, wherein the acute angle is between about 15 degrees and about 75.

6. A method for cleaning a wafer as recited in claim 1, wherein the acute angle is about 45 degrees.

7. A method for cleaning a wafer as recited in claim 1, wherein the acute angle is about 45 degrees.

8. A method for cleaning a wafer as recited in claim 2, further comprising:

scrubbing a wafer with the brush.

9. A method for cleaning a wafer with a drip manifold including at least one drip nozzle comprising:

inputting a fluid into a first end of the at least one drip nozzle at an acute angle relative to a wall that extends longitudinally between the first end and a second end of the at least drip nozzle;

reflecting the fluid stream off an internal wall of the at least one drip nozzle at least twice in a direction that is toward the second end of the at least one drip nozzle; and outputting at least one substantially uniform drop from the second end of the passage at a consistent rate; and applying the at least one substantially uniform drop onto a brush.

10. A method for cleaning a wafer as recited in claim 9, wherein the drip manifold is integrated into a cleaning station and the drip manifold extends over a length of the brush.

11. A method for cleaning a wafer as recited in claim 9, wherein inputting a fluid into the drip nozzle includes introducing the fluid into the first end.

12. A method for cleaning a wafer as recited in claim 9, wherein the acute angle is between about 15 degrees and about 75.

13. A method for cleaning a wafer as recited in claim 9, wherein the acute angle is about 45 degrees.

14. A method for cleaning a wafer as recited in claim 9, wherein the acute angle is about 45 degrees.

15. A method for cleaning a wafer as recited in claim 9, further comprising:

scrubbing a wafer with the brush.

16. A method for cleaning a wafer with a drip manifold including at least one drip nozzle comprising:

inputting a fluid into a first end of the drip nozzle at an acute angle relative to a wall that extends longitudinally between the first end and a second end of the drip nozzle;

reflecting the fluid stream off an internal wall of the drip nozzle at least twice in a direction that is toward the second end of the drip nozzle; and outputting at least one substantially uniform drop from the second end of the passage at a consistent rate;

applying the at least one substantially uniform drop onto a brush; and scrubbing a wafer with the brush.

17. A method for cleaning a wafer as recited in claim 16, wherein the drip manifold is integrated into a cleaning station and the drip manifold extends over a length of the brush.

18. A method for cleaning a wafer as recited in claim 16, wherein inputting a fluid into the drip nozzle includes introducing the fluid into the first end.

19. A method for cleaning a wafer as recited in claim 16, wherein the acute angle is between about 15 degrees and about 75.

20. A method for cleaning a wafer as recited in claim 16, wherein the acute angle is about 45 degrees.

* * * * *